(12) United States Patent
Portacci

(10) Patent No.: US 6,172,901 B1
(45) Date of Patent: Jan. 9, 2001

(54) LOW POWER STATIC RANDOM ACCESS MEMORY AND METHOD FOR WRITING TO SAME

(75) Inventor: Giuseppe Vito Portacci, Vimercate (IT)

(73) Assignee: STMicroelectronics, S.r.l., Agrate Brianza (IT)

( * ) Notice: Under 35 U.S.C. 154(b), the term of this patent shall be extended for 0 days.

(21) Appl. No.: 09/475,318

(22) Filed: Dec. 30, 1999

(51) Int. Cl.$^7$ .................................................. G11C 11/00
(52) U.S. Cl. ........................................... 365/154; 365/156
(58) Field of Search ................................... 365/154, 156, 365/207, 206, 129

(56) References Cited

U.S. PATENT DOCUMENTS

| | | | | |
|---|---|---|---|---|
| 4,956,815 | * | 9/1990 | Houston | 365/154 |
| 5,574,687 | * | 11/1996 | Nakase | 365/189.06 |
| 5,745,415 | * | 4/1998 | Marr | 365/201 |
| 5,852,572 | * | 12/1998 | Jung et al. | 365/154 |
| 6,005,794 | * | 12/1999 | Sheffield et al. | 365/154 |
| 6,038,168 | * | 3/2000 | Allen et al. | 365/185.07 |

* cited by examiner

Primary Examiner—David Nelms
Assistant Examiner—Hoai V. Ho
(74) Attorney, Agent, or Firm—Theodore E. Galanthay; Robert Iannucci; Seed Intellectual Property Law Group PLLC

(57) ABSTRACT

Described is an SRAM cell made from two cross-coupled inverters. The output from each inverter is a data node, and the two data nodes store logical complementary signals. Each data node is connected to a pass transistor that is coupled directly to the power supply voltage, rather than coupled to a pair of bitlines. The inverters can be connected to a reading circuit, a writing circuit, or a stand-by circuit as desired for different phases of the memory operation. Data is read from the SRAM cell by using a current sensing differential amplifier. Data is written to the SRAM cell by controlling voltages on the cross-coupled inverters, and compatible with conventional writing signals.

27 Claims, 7 Drawing Sheets

LOW POWER STATIC RANDOM ACCESS MEMORY AND METHOD FOR WRITING TO SAME

TECHNICAL FIELD

This invention relates to a static random access memory (SRAM) that uses low power, and a method for writing data to the low power SRAM.

BACKGROUND OF THE INVENTION

In order to guarantee long battery life in mobile equipment, it is essential to minimize power consumption during periods of operation and stand-by periods. A stand-by period is a time when the mobile equipment is powered, but not operating at its full power draw. Further, in order to fully exploit the latest integration capability using the latest process technology, such as a complete system on a chip, several factors must be in place, such as reduced heat generation, simplified packaging, improved device reliability compared to prior devices, and reduced power consumption during all periods of operation.

An effective way to reduce power consumption during operation is to decrease the power supply voltage, because the current consumption is approximately proportional to the square of the supplied voltage. When the power supply voltage is reduced, the power consumed is also reduced. However, a reduced power supply voltage produces a drastic degradation of device performance, because the turn-on threshold voltage (threshold) of the transistors of the devices is generally not reduced, in order to avoid an increased leakage during the stand-by periods. This gives less of a margin for error in a transistor switching voltage, as well as reduces the switching speed of the device. Because high speed is desirable in multimedia devices, and high data throughput of a multimedia device depends on switching speed of the components making up the device, reducing the power supply voltage generally results in slower, rather than faster devices.

Embedded SRAMs are fundamental components in many Ultra Large Scale Integrated (ULSI) circuits, which are used to make modern electronics and devices, including multimedia devices. SRAMs are important sources of power dissipation because they contain a large number of frequently accessed internal busses (word lines, bitlines, data lines, etc), that are heavily loaded by transistors and parasitic metal interconnected capacitances.

A standard SRAM cell 10 is shown in FIG. 1. The cell 10 consists of four central transistors 20, 22, 30 and 32, connected in a cross-coupled inverter, or "latch" configuration. Typically, the two load transistors 20, 30 are PMOS transistors, while the drive transistors 22 and 32 are NMOS. Two pass transistors 26, 36 allow read and write access to a data node DATA 28, and a data node $\overline{DATA}$ 38, respectively. Control gates of the two pass transistors 26, 36, are coupled together and to a word line WL, which connects to all of the pass transistors of the cells in one row. The pass transistor 26 is coupled to a bitline BL, while the pass transistor 36 is coupled to a bitline complement, $\overline{BL}$. The bitlines BL and $\overline{BL}$ are common to all of the pass transistors in one column.

The data nodes DATA and $\overline{DATA}$ are outputs of the inverters, and store the data of the memory cell 10. Data is stored as the presence or absence of a certain voltage at the data nodes. Conventionally, a voltage that is near a power supply reference voltage, for instance a Vdd, is referred to as a logic "1", HIGH, or ON, while a voltage near a lower reference voltage, for instance a ground voltage, is referred to as logic "0", LOW, or OFF. The structure of the latch provides that the data nodes DATA and $\overline{DATA}$ are always logical complements of one another, meaning that, after the inverters have flipped and the data has latched, one node will be logic "1" while the other will be logic "0". Once the data is set at the data node DATA (and, consequently, the data complement is set at the data node $\overline{DATA}$), it will remain there as long as the Vdd voltage is supplied to the cell 10.

To write data to the SRAM cell 10, one of the bitlines that is typically charged to Vdd (bitlines BL or $\overline{BL}$) is discharged almost to ground, while the other is left at Vdd or allowed to float. Driving the selected bitline to ground causes the data to be loaded into the data nodes DATA and $\overline{DATA}$. For example, assume the data node DATA is currently at logic "1", and it is desired to change it to logic "0". The line BL is brought to near ground, while the line $\overline{BL}$ stays at Vdd, or floats. The word line WL is brought high, turning on the pass transistors 26, 36. The DATA node DATA discharges, first through the line BL, then through the transistor 22. When the latch switches, transistors 20 and 32 are OFF, while transistors 22 and 30 are ON, bringing the data node DATA to ground, or logic "0" (because transistor 22 couples it to ground), and bringing the data node $\overline{DATA}$ to Vdd, or logic "1" (because transistor 30 couples it to Vdd). Following the write operation, the wordline WL is disabled, and the bitlines BL and $\overline{BL}$ are again pre-charged to Vdd for the next accesses.

The bitlines BL and $\overline{BL}$ are heavily loaded lines in the memory array, and, because the bitline BL has a large voltage swing during the writing of the array (almost from Vdd to ground), this standard writing operation uses a lot of power because the bitline must be first discharged, then re-charged. As seen in an SRAM device 100 of FIG. 2, the memory cell 10 is a small part of a memory cell array 50. A decoder 60 and data line multiplexer 70 couple to the array, providing the appropriate signals to write to and read from all of the memory cells 10 in the memory cell array 50. Control logic 80 accepts control and address signals, while the data I/O 90 accepts and presents the data written to or read from the memory cell array 50. It is plain to see that the bitlines BL and $\overline{BL}$ run throughout the memory cell array 50, and thus are have a heavily loaded lines.

Many techniques to reduce power consumption in SRAMs have been employed, such as reducing bitline voltage swing by utilizing current sensing circuits, or by pulsing word line selection signals. Also, in order to reduce loading, the memory array is often divided into local word and bitlines. However, all of these approaches require additional circuitry, and have had mixed results, reducing the overall power used.

SUMMARY OF THE INVENTION

One embodiment of the invention presents an SRAM cell formed by a pair of cross-coupled inverters. The output from each inverter is a data node, and the two data nodes store logical complementary signals. Also, each data node is connected to a pass transistor that is coupled directly to the power supply voltage, rather than coupled to a pair of bitlines. The inverters can be coupled to a reading circuit, a writing circuit, or a stand-by circuit as desired for different phases of the memory operation.

Another embodiment of the invention presents a method for writing data to the above-described SRAM memory cell. In this method write signals couple the first source data line and the second source data line, which are nodes on the inverters, to a reference voltage. Then, the voltage at one of

DETAILED DESCRIPTION

In this description, discussion of steps or architectures well known to those skilled in the art has been abbreviated or eliminated for brevity. Although this description describes particular embodiments of the invention shown in the figures, the invention is not limited only to those embodiments discussed.

Figure 3:
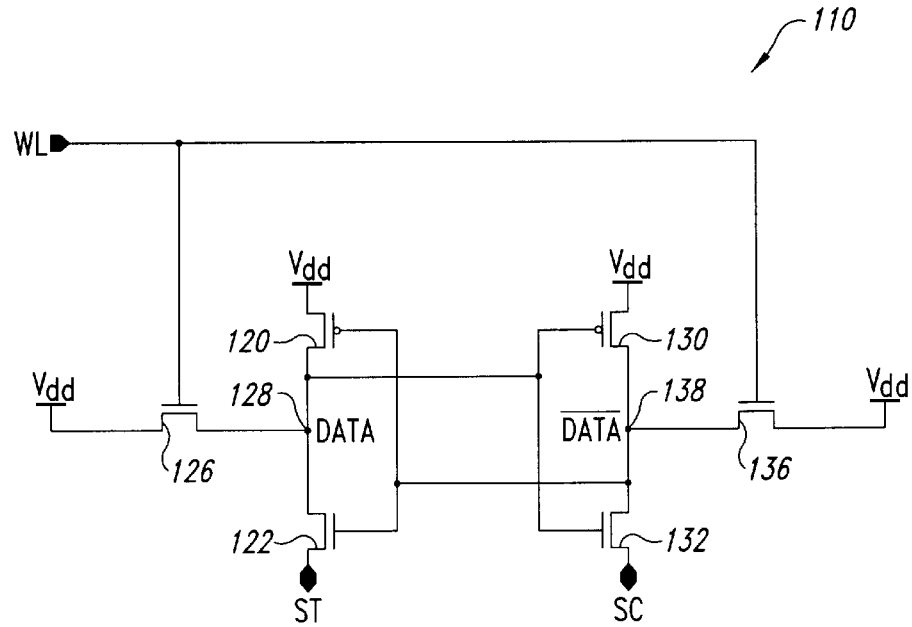
FIG. 3 is a schematic diagram of an SRAM memory cell according to an embodiment of the invention.

FIG. 3 shows an SRAM memory cell 110 according to an embodiment of the invention. The body of the cell is made of load transistors 120, 130 of the PMOS type, and drive transistors 122, 132, of the NMOS type. Similar to the memory cell 10, this provides a data node DATA 128, and a data node $\overline{\text{DATA}}$ 138, which are logical complements of one another. Unlike the prior art memory cell 10, no bitlines are coupled to the memory cell 110. Instead, two pass transistors, 126, 136, have their drains directly connected to Vdd, inside the memory cell. Source data lines ST and SC are common to all the cells in the same column and have the same functionality as bitlines in traditional memory cells, for example the memory cell 10 shown in FIG. 1.

Due to its unique construction, the memory cell 110 is well suited for high density devices. For instance, because source data lines replace the typical bitlines, no additional signal lines are needed. Additionally, there is no need for a grounding line within the memory cell 110, as was required in the memory cell 10.

Figure 1:
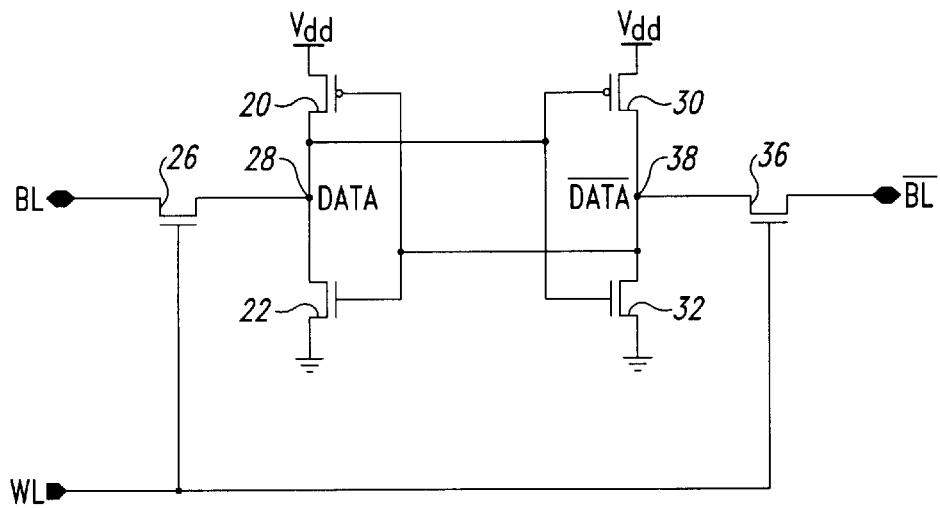
FIG. 1 is a schematic diagram of a conventional SRAM memory cell.
Figure 2:
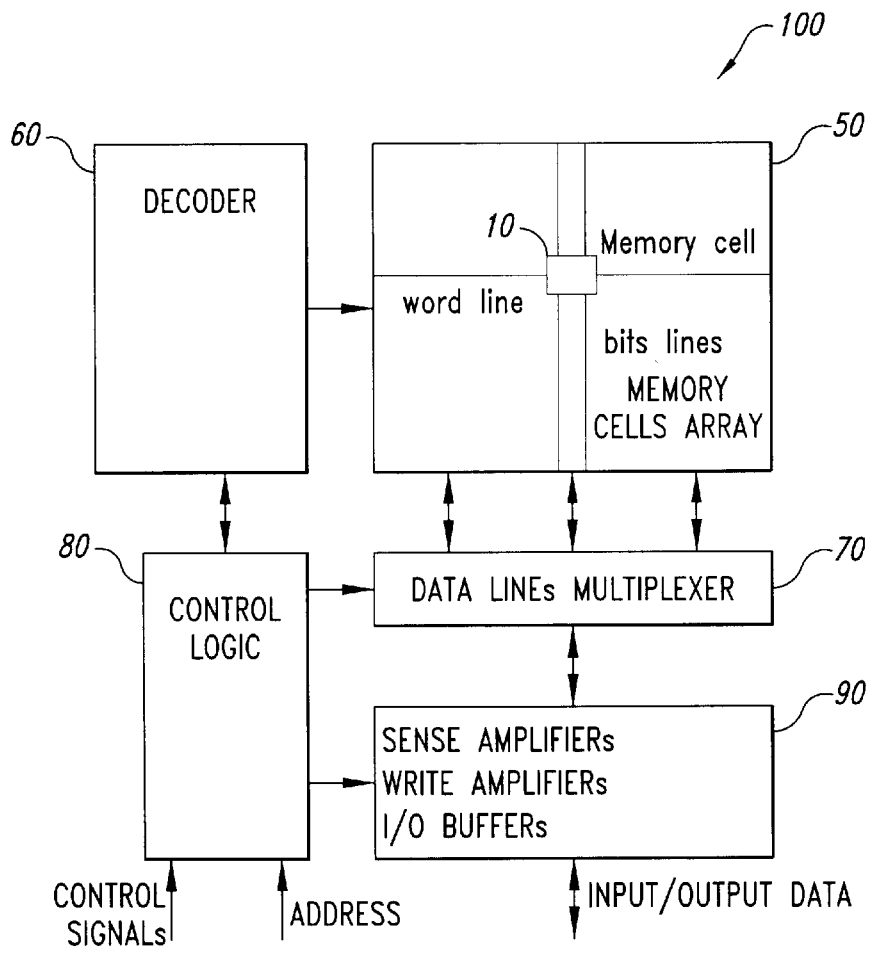
FIG. 2 is a block diagram of a conventional SRAM memory device.
Figure 4:
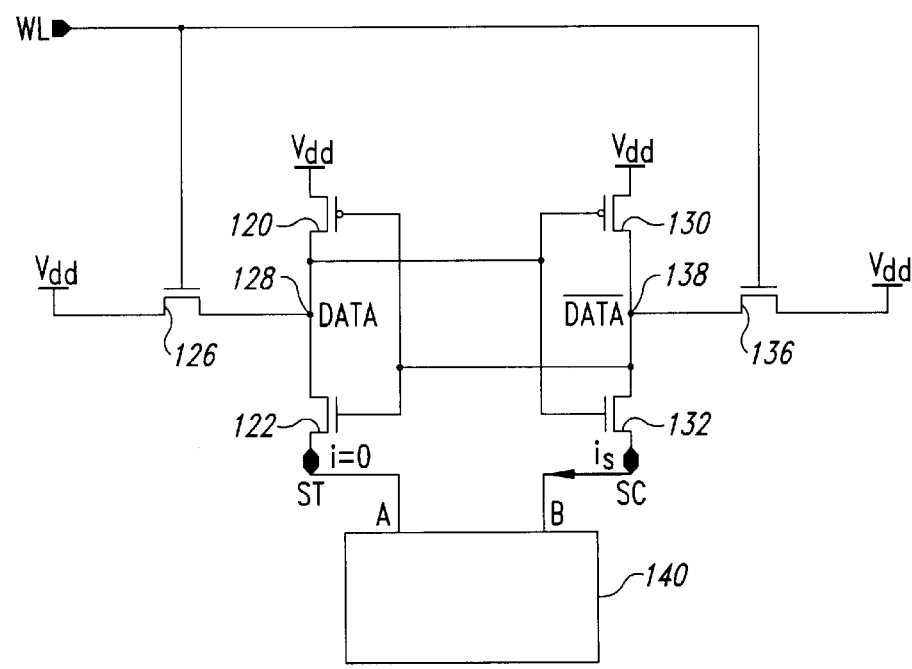
FIG. 4 is a block diagram showing the SRAM memory cell of FIG. 3 coupled to a memory reading circuit.

As the SRAM memory cell 110 has no bitlines, it cannot be read in the conventional way that the memory cell 10 of FIG. 1 is read. To read the SRAM memory cell 110, a current sensing differential amplifier is used. As shown in FIG. 4, the source data lines SC and ST of the memory cell 110 are coupled directly to a current sensing amplifier 140. During a reading operation, the pass transistors 126, 136 are turned on, and the source data lines ST and SC are near the ground voltage. Because either the data node DATA or $\overline{\text{DATA}}$ stores a logic "1", there will be a current path created from the Vdd node through one of the pass transistors 126, 136, and through one of the drive transistors 122, 132, into the current sensing amplifier 140.

For example, if the data node DATA holds a logic "1", the drive transistor 132 will be turned on. Because the pass transistor 136 is likewise on, current travels from the Vdd node, through the transistors 136 and 132, along the source data line SC into the current sensing amplifier 140. No such current will be present on the source data line ST, because the data node $\overline{\text{DATA}}$ will store a logic "0", thereby keeping drive transistor 122 in an OFF state. Since current is flowing through one source data line (SC), but not the other (ST), the current sensing amplifier 140 can detect and amplify this difference, thereby reading the contents of the memory cell 110.

Figure 5:
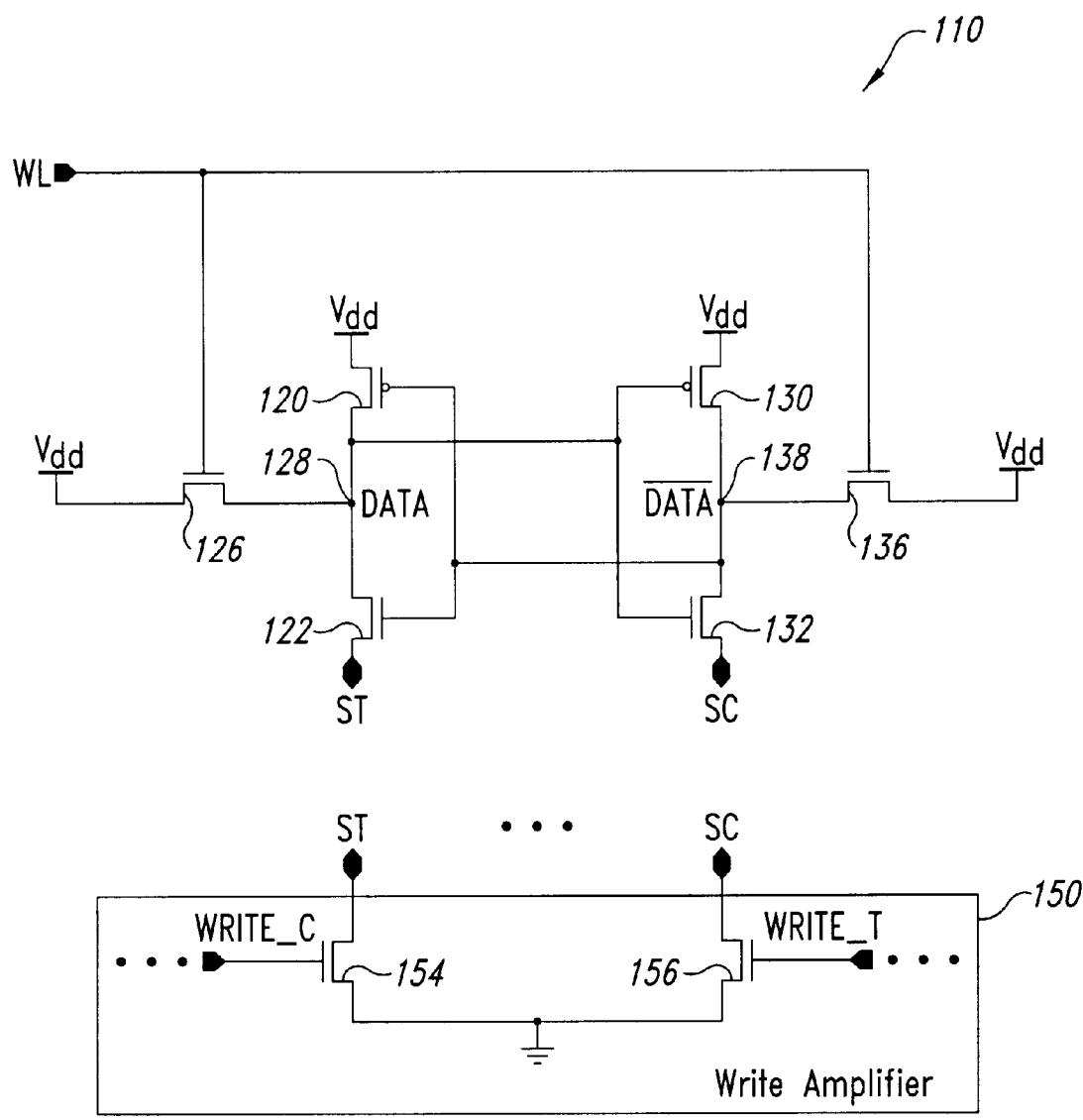
FIG. 5 is a schematic diagram showing the SRAM memory cell of FIG. 3 coupled to a writing circuit.

Writing data to the memory cell 110 is also different than writing data to the memory cell 10 of FIG. 1. FIG. 5 shows the memory cell 110 coupled to a write amplifier 150. The write amplifier 150 includes two NMOS write transistors 154, 156. The write transistor 154 is coupled between the source data line ST and the ground voltage, and the write transistor 156 is coupled between the source data line SC and the ground voltage. The write transistor 154 has a control gate coupled to a WRITEC signal, while a control gate of write transistor 156 is coupled to a WRITET signal.

During normal memory operations, when no write access is occurring, both WRITEC and WRITET are held at Vdd, thereby enabling the corresponding write transistors 154, 156 and coupling the source data lines ST and SC to ground. This provides a Static Noise Margin (SNM), which is the minimum voltage noise able to make the memory cell 110 change from one stable states to the other, the same as for traditional memory cells, such as the memory cell 10 of FIG. 1. When pass transistors 126, 136 are turned on, the voltage on the low node does not rise over the threshold voltage of the drive transistor 122 or 132.

During a writing operation, one of the write signals WRITEC or WRITET is set to 0 and the other maintains its Vdd voltage. For instance, in order to write a logic "1" to the data node DATA, the write signal WRITEC is set to "0", while WRITET remains at logic "1". Because WRITEC is at "0", the write transistor 154 is turned OFF, and the source data line ST is no longer coupled to ground. The data node DATA is charged through pass transistor 126 until it reaches the turn-on voltage of the drive transistor 132, the source of which is connected through the write transistor 156 to ground. The data node $\overline{\text{DATA}}$ the discharges through the drive transistor 132, dropping to the logic "0", and thereby turning off the drive transistor 122. The latch made by the transistors 120, 122, 130 and 132 flips to its new stable state, with the data node DATA containing a logic "1", and the data node $\overline{\text{DATA}}$ containing a logic "0". The word line WL is then disabled and the write signal WRITEC again set to logic "1", thereby turning on the write transistor 154 and retaining the new data in the memory cell 110.

In order to change the contents of the data node DATA of the memory cell 110 to a logic "0", the write signals are inverted from the example listed above. Therefore, WRITEC remains set to "1", while WRITET changes to logic "0". This turns ON write transistor 154, while write transistor 156 will be turned OFF, thereby disconnecting the node SC from ground. Because the word line WL is ON, and thus the pass transistors 126 and 136 are ON, the data node $\overline{\text{DATA}}$ is charged through the pass transistor 136 until it reaches the turn-on voltage of the transistor 122, the source of which is connected through the write transistor 154 to ground. The data node DATA discharges through the drive transistor 122, dropping to the logic "0", and thereby turning off the transistor 132. The latch again flips to its new stable state, with the data node $\overline{\text{DATA}}$ containing a logic "1", and the data node DATA containing a logic "0". The word line WL is again disabled and the write signal WRITET is again set to logic "1", thereby turning on the write transistor 156 and retaining the new datum in the memory cell 110.

Power consumption in the memory cell 110 is related to the existence of a DC path between Vdd and ground, through the pass transistors 126, 136, the drive transistors 122, 132, and the write transistors 154, 156. It is also related to the current that charges the ST node, because during the first phase of writing a logic "1" to the data node DATA, the drive transistor 122 in the memory cell 110 is still conducting. The total current depends on the number of cells connected to the same ST source line. In any event, the voltage to which the ST node rises is small, and is less than the turn-on threshold voltage of the drive transistor 132. As the only line that is charged when writing a logic "1" to the data node DATA of the memory cell 110 is the source line ST, and that line is only charged up to a few hundred millivolts less than the turn-on threshold voltage of the drive transistor 132, writing requires much less power than the prior art memory cell 10, shown in FIG. 1.

If the data node DATA already contains a logic "0", then when writing another logic "0" to the data node DATA, even less power is consumed than when writing a logic "1". That is because the internal nodes do not change states, and no source data lines are charged. The source data lines ST, SC stay close to ground and power consumption in the memory cell 110 is almost the same as for non-accessed cells in the same row of a memory device.

Figure 6:
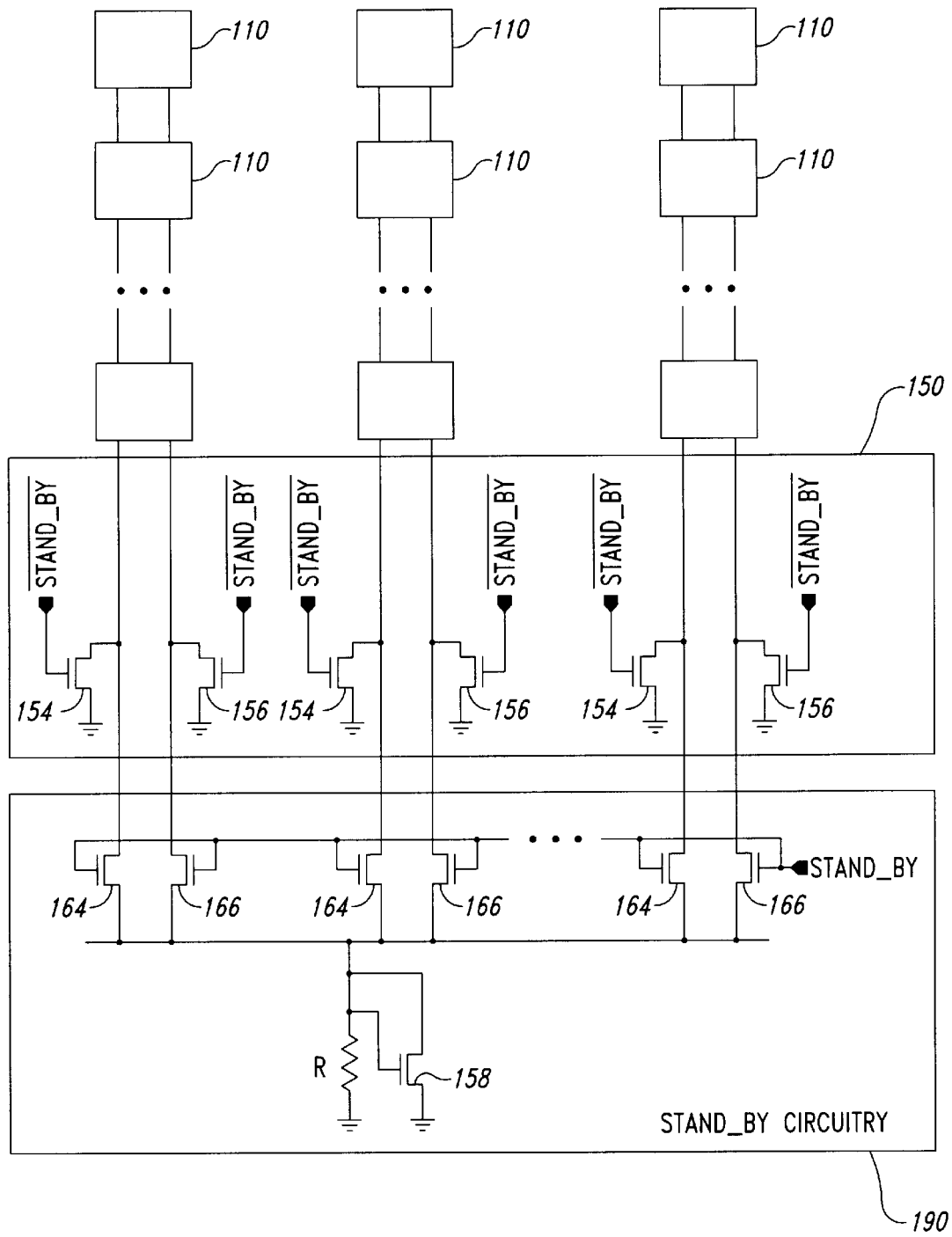
FIG. 6 is a schematic diagram showing the SRAM memory cell of FIG. 3 coupled to a stand-by circuit.

Power consumption during a stand-by period of the memory cell is also reduced according to an embodiment of the invention described with reference to FIG. 6. In that figure, the memory cell 110 is coupled to a stand-by circuit 190. By connecting all of the source data lines ST, SC in a memory array to ground through a resistive path R outside all of the disabled write transistors 154, 156, the voltage drop due to the leakage current on this resistor R can be used to bias the source terminals of the drive transistors 122, 132. This is done through a set of stand-by transistors 164, 166, setting a STAND_BY signal to logic "1", and a $\overline{\text{STAND\_BY}}$ signal to logic "0." The $\overline{\text{STAND\_BY}}$ signal is also coupled to gates of the write transistors 154, 156 of the write amplifier 150, thus keeping the write transistors 154, 156 OFF. In this way, the turn-on threshold voltage of the drive transistors 122, 132 increases, due to the increased body effect, and their gate to source voltages decreases. In the new operating point, leakage current is strongly reduced in a self-controlled biasing process. Transistor 158 in FIG. 6 is used to limit the voltage drop on the resistor R to a value equal to its turn on threshold voltage, for SRAM memory cell stability.

In yet another embodiment of the write amplifier 150, for use with a multi-threshold process having different transistors in the same area of a memory circuit having different threshold voltages, the write transistors 154, 156 of the write amplifier 150, and the PMOS load transistors 120, 130 are all low-leakage (LL) transistors. Low-leakage transistors have a high threshold voltage. Then, during a stand-by state where both of the write transistors 154, 156 are turned OFF by the $\overline{\text{STAND\_BY}}$ signal, the power consumption due to leakage is almost the same as if only LL transistors are used for all of the transistors in the memory cell 110. This is true even if high-speed (HS) transistors, which have a low turn-on threshold voltage, are used for the drive transistors 122, 132 because there is no path existing from Vdd to ground without passing through one of the low-leakage transistors.

The capacitive loading on the source date lines ST, SC, helps to retain the data in the data nodes DATA and $\overline{\text{DATA}}$, however, due to the transistor memory cell leakage, the source data lines ST and SC are gradually charged. In order to maintain the data, a refresh operation is necessary, where both of the write transistors 154, 156 are turned on in the write amplifier 150. This resets the source data lines ST, SC to ground, in order to retain the data at the data nodes DATA and $\overline{\text{DATA}}$ in the memory cell 110.

Regarding the stability of cells that are not selected but that are in the same word line as the cell being written to, the SNM is almost the same as for the traditional circuitry, due to the good conductivity of the write transistors 154, 156. For the memory cells belonging to the same column, and thus having the same source data lines as the selected cell 110, the voltage on the common source line is applied through the driver transistors 122, 132, when conducting according to the datum written to the cell, to the internal memory cells nodes. Therefore, the noise margin depends on the source line voltage, and for this reason on source line capacitive loading and the drive transistor 122, 132 conductivity. In any case, the source data lines are charged to a voltage less than the threshold voltages of the drive cells 122, 132, because when this voltage is reached in the accessed memory cell, the corresponding drive transistor 122, 132 is turned off. This disconnects the cell from the common source line, and the voltage is not enough to make the non-selected cell flip.

The writing time depends on the parasitic capacitance loading on the source data lines ST and SC, with a higher capacitance slowing the writing time. In order to improve speed, a divided memory cell array can be used in low-power memory cells to reduce the loading.

Figure 7A:
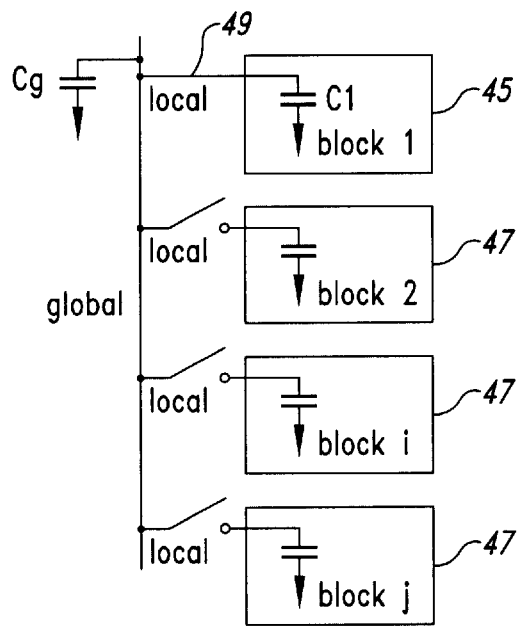
FIGS. 7A and 7B are a block diagram showing representative capacitive loading of memory cells.
Figure 7B:
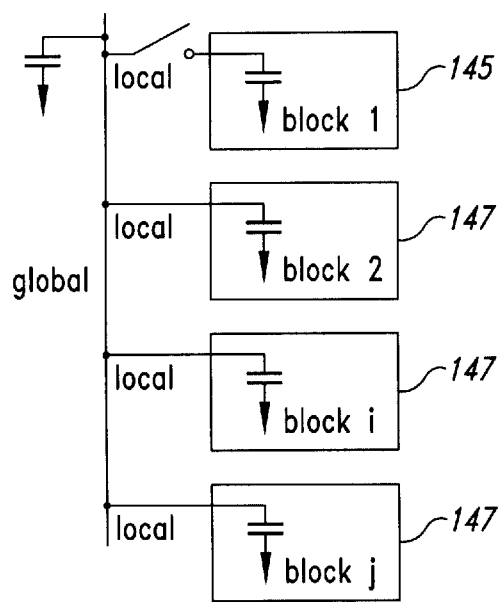

FIGS. 7*a* and 7*b* respectively show block diagrams of relative capacitive loading of a selected block 45 of traditional memory cells 10 and a selected block 145 of memory cells 110 according to an embodiment of the invention. The selected block 45, 145 is in the top block for both FIGS. 7*a* and 7*b*, while unselected blocks 47 and 147 are shown below the respective selected blocks. In FIG. 7*a*, a switch 49 between the global and local data line is closed, thus the capacitive loading that determines the writing operation speed is Cg+Cl (the global capacitance plus local capacitance), because the bitlines have to discharge through both the global and selected local bitline. In FIG. 7*b*, only the local capacitance is important, because only the local source data lines of the selected bank have to be considered, which are not connected to the global data line. Since the local capacitances of both selected blocks of cells 45, 145 is about equal, the total capacitance of the memory cell 110 shown in FIG. 7*b* is less than the selected block 45 of the prior art cells 10, represented in FIG. 7*a*.

A further way to increase the charging speed of the memory cell 110 is to pre-charge the source data line prior to writing to the memory cell, instead of leaving the line floating. The selected source line is charged to a voltage value close to the threshold voltage of the drive transistors 122, 132. By charging the selected source line to a voltage a few hundred millivolts less than the threshold voltage, stability of the memory cell 110 will be preserved.

Figure 8:
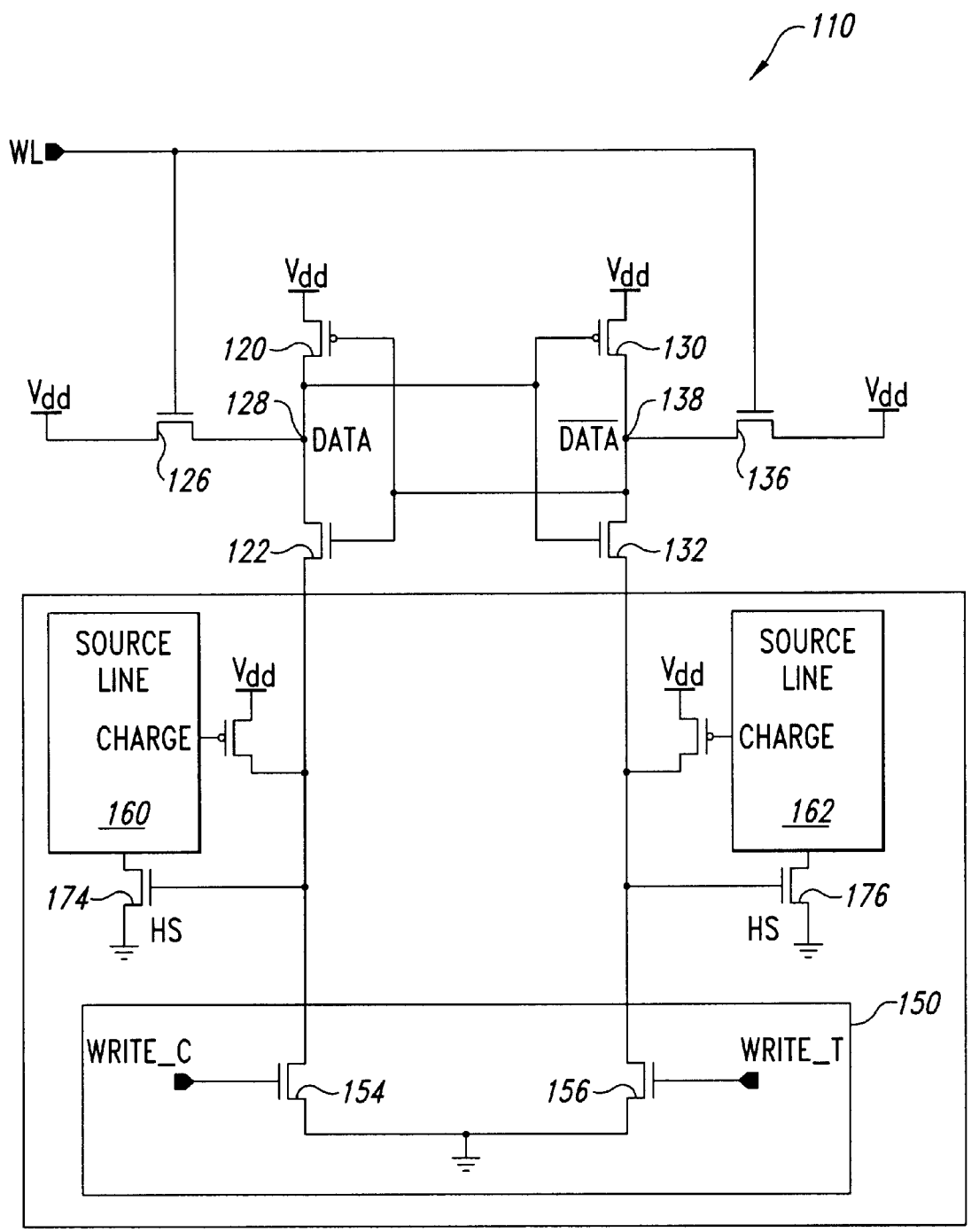
FIG. 8 shows a write amplifier for use with multiple threshold technologies.

Pre-charging the source line is easily performed using a multi-threshold technology process, which is a process where different transistors in the same area of a memory circuit have different threshold voltages. FIG. 8 shows an example of a possible implementation of the memory cell 110 using a multi-threshold process.

In FIG. 8, the memory cell 110 is coupled to the write amplifier 150, similar to the configuration shown in FIG. 5. In addition, a pair of source line charging circuits 160, 162 are coupled to the ST line and the SC line, respectively. Coupled to the source line charging circuit 160 is a high-speed transistor 174, and coupled to the source line charging circuit 162 is a high-speed transistor 176. The source line charging circuits are operative to charge the respective source data lines ST, SC. Once the source data lines ST and SC are sufficiently charged, e.g., to a hundred millivolts less than the drive transistors 122, 132, the high-speed transistors 174, 176 turn on to discontinue the charging of the source data lines, and keep them fully charged.

Figure 9:
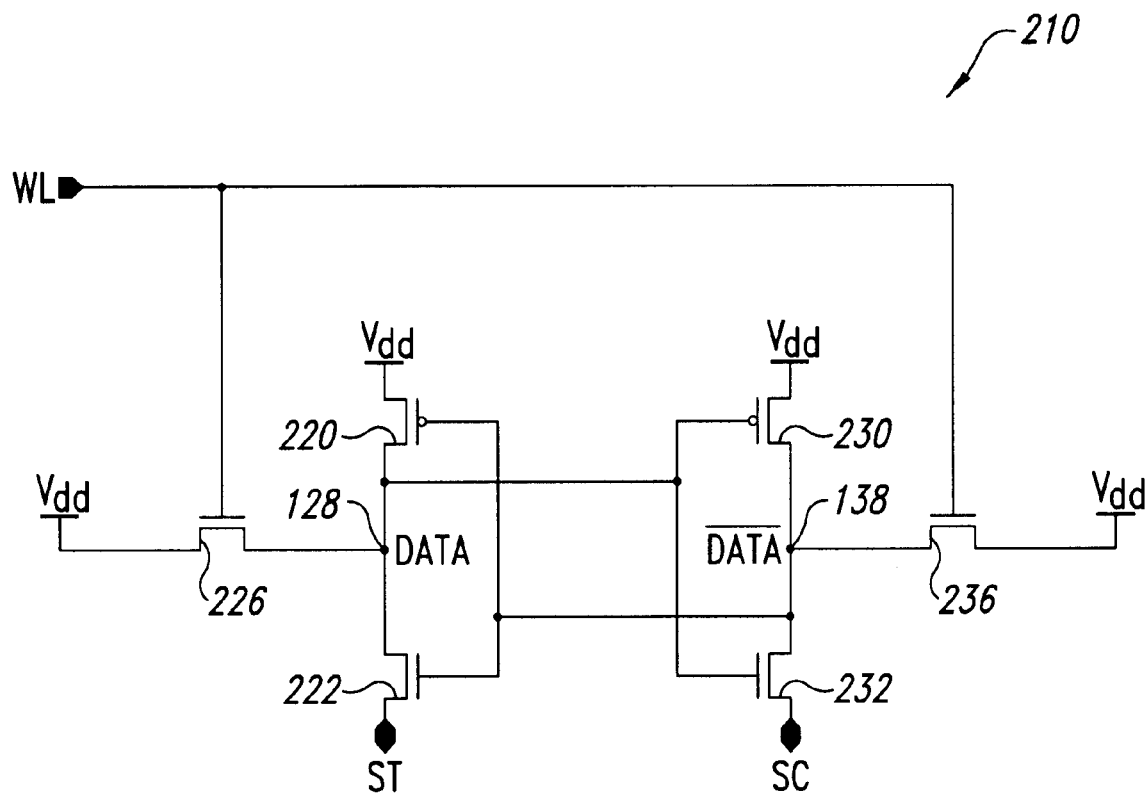
FIG. 9 is a schematic diagram showing another embodiment of the SRAM memory cell.

FIG. 9 shows a second embodiment of the invention, an ultra-low voltage memory cell 210. One of the differences between the ultra-low voltage memory cell 210 and the memory cell 110 of FIG. 3 is the presence of PMOS pass transistors in the ultra-low cell. PMOS pass transistors 226, 236 must be used in this embodiment because if NMOS pass transistors were used, they could not sufficiently charge data nodes DATA and $\overline{\text{DATA}}$ that are internal to the memory cell 210.

The use of PMOS transistors 226, 236 increases the SNM of the memory cell 210 because PMOS transistors have a conductivity less than the NMOS transistors. When using PMOS transistors for the pass transistors 226, 236, the designer must be aware that the reading current will be less than if NMOS transistors are used, such as in the memory cell 110. However, this is easily overcome by selecting the proper current sensing amplifier 140.

The ultra-low voltage memory cell 210 allows for a reduction in size of the memory cell so that it can be implemented with a smaller footprint than even the memory cell 110. This layout is furthered because the PMOS pass transistors 226, 236 can be formed in the same N-well as a set of load transistors 220, 230. Additionally, the size of drive transistors 222 and 232, which are typically NMOS, can be reduced even further because the PMOS pass transistors 226, 236 have a conductivity less than equally sized NMOS transistors.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A memory device including one or more memory cells, at least one of the memory cells an SRAM cell comprising:
    a pair of cross-coupled inverters, each one coupled between a power supply reference voltage, and a second reference voltage;
    a first data node at an output of a first of the pair of inverters;
    a second data node at an output of a second of the pair of inverters;
    a first pass transistor coupled directly between the power supply reference voltage and the first data node;
    a second pass transistor coupled directly between the power supply reference voltage and the second data node; and
    wherein the gate of the first and second pass transistors are connected together to a word line.

2. The SRAM cell of claim 1 further comprising:
    a data writing circuit coupled between the cross-coupled inverters and the second reference voltage.

3. The SRAM cell of claim 2 wherein the data writing circuit comprises:
    a first writing transistor coupled between the first of the pair of inverters and the second reference voltage, the first writing transistor having a control gate connected to a data writing signal; and
    a second writing transistor coupled between the second of the pair of inverters and the second reference voltage, the second writing transistor having a control gate connected to a data complement writing signal.

4. The SRAM cell of claim 3 wherein the first writing transistor and the second writing transistor are switchably connectable to their respective inverters, the switchable connection being made responsive to a signal controlling a state of the SRAM cell.

5. The SRAM cell of claim 1 further including a stand-by circuit, the stand-by circuit comprising:
    a stand-by terminal structured to receive a stand-by signal;
    a resistor coupled to the second reference voltage;
    a first stand-by transistor coupled between the first of the pair of inverters and the resistor, and structured to receive the stand-by signal at a control terminal by way of a first conduction line; and
    a second stand-by transistor coupled between the second of the pair of inverters and the resistor, and structured to receive the stand-by signal at a control terminal by way of a second conduction line.

6. The SRAM cell of claim 5 further comprising a limiting transistor, having a first terminal coupled to the resistor, a gate terminal coupled to the resistor, and a second terminal coupled to the second reference voltage.

7. The SRAM cell of claim 3 having a first source data line as a signal line coupled between the first writing transistor and the first of the pair of inverters, and having a second source data line as a signal line coupled between the second writing transistor and the second of the pair of inverters, the SRAM cell further comprising:
    a first pre-charging circuit coupled to the first source data line; and
    a second pre-charging circuit coupled to the second source data line.

8. The SRAM cell of claim 7 further comprising:
    a first high-speed transistor coupled between the first pre-charging circuit and the second reference voltage, the first high-speed transistor having a control terminal coupled to the first source data line; and
    a second high-speed transistor coupled between the second pre-charging circuit and the second reference voltage, the second high-speed transistor having a control terminal coupled to the second source data line.

9. The SRAM cell of claim 1 further comprising:
    a data reading circuit switchably coupled between the pair of cross-coupled inverters and the second reference voltage.

10. The SRAM cell of claim 9 wherein the data reading circuit comprises:
    a current sensing differential amplifier having a first input coupled between the first of the pair of inverters and the second reference voltage; and
    the current sensing differential amplifier having a second input coupled between the second of the pair of inverters and the second reference voltage.

11. The SRAM cell of claim 10 wherein the current sensing differential amplifier, responsive to a reading signal, is structured to determine contents of the SRAM cell and produce an output signal indicating the contents of the SRAM cell.

12. The SRAM cell of claim 1 wherein the first pass transistor and the second pass transistors are both PMOS transistors.

13. An SRAM cell comprising:

a first load transistor coupled between a power supply voltage and a first data node;

a first drive transistor coupled between the first data node and a first source data line;

a second load transistor coupled between the power supply voltage and a second data node;

a second drive transistor coupled between the second data node and a second source data line;

a first control line coupled between the first data node and a control terminal of the second load transistor, and coupled to a control terminal of the second drive transistor;

a second control line coupled between the second data node and a control terminal of the first load transistor, and coupled to a control terminal of the first drive transistor;

a first pass transistor, coupled directly between the power supply voltage and the first data node;

a second pass transistor, coupled directly between the power supply voltage and the second data node; and wherein the gates of the first and second pass transistors are connected together to a word line.

14. The SRAM cell of claim 13 further comprising a data writing circuit including:

a first writing transistor coupled between the first source data line and a reference voltage, the first writing transistor having a control gate connected to a data writing signal; and a second writing transistor coupled between the second source data line and the reference voltage, the second writing transistor having a control gate connected to a data complement writing signal.

15. The SRAM cell of claim 14 wherein the first writing transistor and the second writing transistor are switchably connectable to their respective source data lines, the switchable connection being made responsive to a signal controlling a state of the SRAM cell.

16. The SRAM cell of claim 13 further including a stand-by circuit comprising:

a stand-by terminal structured to receive a stand-by signal;

a resistor coupled to a reference voltage;

a first stand-by transistor coupled between the first source data line and the resistor, and structured to receive the stand-by signal at a control terminal by way of a first conduction line; and a second stand-by transistor coupled between the second source data line and the resistor, and structured to receive the stand-by signal at a control terminal by way of a second conduction line.

17. The SRAM cell of claim 16 further comprising a limiting transistor having a first terminal coupled to the resistor, a gate terminal coupled to the resistor, and a second terminal coupled to the reference voltage.

18. The SRAM cell of claim 13 further comprising:

a first pre-charging circuit coupled to the first source data line;

a second pre-charging circuit coupled to the second source data line;

a first high-speed transistor coupled between the first pre-charging circuit and the reference voltage, the first high-speed transistor having a control terminal coupled to the first source data line; and a second high-speed transistor coupled between the second pre-charging circuit and the reference voltage, the second high-speed transistor having a control terminal coupled to the second source data line.

19. The SRAM cell of claim 13 further comprising a data reading circuit including:

a current sensing differential amplifier having a first input coupled to the first source data line and having a second input coupled to the second source data line.

20. The SRAM cell of claim 13 wherein the first pass transistor and the second pass transistors are both PMOS transistors.

21. A method of writing data to an SRAM cell of a memory device that includes one or more SRAM memory cells including a first inverter having a first data node and coupled between a power supply voltage and a first source data line, a first pass transistor coupled directly between the power supply voltage and the first data node, and the one or more SRAM cells including a second inverter having a second data node and coupled between the power supply voltage and a second source data line, the first and the second inverter connected to one another in a cross-coupled relationship, and a second pass transistor coupled directly between the power supply voltage and the second data node, and wherein the gates of the first and second pass transistors are connected together to a word line, the method comprising:

coupling the first source data line and the second source data line to a reference voltage;

raising a voltage on exactly one of the source data lines to a voltage higher than the reference voltage;

maintaining the raised voltage on the exactly one of the source data lines until the first data node and the second data node store desired voltages; and reducing the voltage on the exactly one of the source data lines to the reference voltage.

22. The method of claim 21 wherein a first write transistor is coupled between the first source data line and the reference voltage and controlled by a first writing signal, and wherein a second write transistor is coupled between the second source data line and the reference voltage and controlled by a second writing signal, and wherein coupling the first source data line and the second source data line to a reference voltage comprises generating a HIGH first writing signal and a HIGH second writing signal.

23. The method of claim 22 wherein raising a voltage on exactly one of the source data lines comprises turning off either the first write transistor or the second write transistor.

24. The method of claim 21 wherein maintaining the raised voltage on the exactly one of the source data lines until the first data node and the second data node store desired voltages comprises maintaining the raised voltage until the first data node and the second data node change stored voltages.

25. The method of claim 21 further comprising:

receiving a stand-by signal; and coupling the first source data line and the second source data line to the reference voltage through a resistive device, responsive to the stand-by signal.

26. The method of claim 25 further comprising:

coupling the first source data line and the second source data line to the reference voltage through a path other than the resistive transistor; and re-coupling the first source data line and the second source data line to the reference voltage through the resistive device.

27. The method of claim 26 wherein the coupling and re-coupling are performed periodically.

* * * * *

UNITED STATES PATENT AND TRADEMARK OFFICE
CERTIFICATE OF CORRECTION

PATENT NO. : 6,172,901 B1
DATED : January 9, 2001
INVENTOR(S) : Giuseppe Vito Portacci Page 1 of 1

It is certified that error appears in the above-identified patent and that said Letters Patent is hereby corrected as shown below:

<u>Column 7, claim 1,</u>
Line 66, "wherein the gate" should read as -- wherein the gates -- in the issued patent.

Signed and Sealed this

Nineteenth Day of March, 2002

Attest:

Attesting Officer

JAMES E. ROGAN
*Director of the United States Patent and Trademark Office*